(12) United States Patent
Lu et al.

(10) Patent No.: US 9,377,286 B2
(45) Date of Patent: Jun. 28, 2016

(54) DEVICE FOR GLOBALLY MEASURING THICKNESS OF METAL FILM

(75) Inventors: Xinchun Lu, Beijing (CN); Dewen Zhao, Beijing (CN); Zilian Qu, Beijing (CN); Qian Zhao, Beijing (CN); Yongyong He, Beijing (CN); Yonggang Meng, Beijing (CN)

(73) Assignee: TSINGHUA UNIVERSITY, Beijing (CN)

( * ) Notice: Subject to any disclaimer, the term of this patent is extended or adjusted under 35 U.S.C. 154(b) by 356 days.

(21) Appl. No.: 13/985,789

(22) PCT Filed: Nov. 17, 2011

(86) PCT No.: PCT/CN2011/082384
§ 371 (c)(1),
(2), (4) Date: Oct. 14, 2013

(87) PCT Pub. No.: WO2012/113246
PCT Pub. Date: Aug. 30, 2012

(65) Prior Publication Data
US 2014/0062468 A1 Mar. 6, 2014

(30) Foreign Application Priority Data
Feb. 25, 2011 (CN) .......................... 2011 1 0046521

(51) Int. Cl.
*G01B 7/06* (2006.01)
*G01B 1/00* (2006.01)
*G01R 1/00* (2006.01)

(52) U.S. Cl.
CPC *G01B 7/10* (2013.01); *G01B 7/105* (2013.01); *G01B 1/00* (2013.01); *G01R 1/00* (2013.01); *H01L 2221/00* (2013.01)

(58) Field of Classification Search
CPC ...... G01R 1/00; H01L 21/00; H01L 2221/00; H01L 2223/00; H01L 2924/00; H01L 2925/00; G01D 1/00; G01Q 1/00; G01B 1/00; G01B 2210/00; G01B 2290/00
See application file for complete search history.

(56) References Cited

U.S. PATENT DOCUMENTS

| 5,182,513 A * | 1/1993 | Young et al. ................... 324/232 |
| 5,833,426 A * | 11/1998 | Marohl ............. H01L 21/67748 414/217.1 |
| 6,639,225 B2 * | 10/2003 | Kirschstein ............. G03F 7/707 250/398 |
| 6,929,531 B2 * | 8/2005 | Gotkis et al. ...................... 451/8 |

(Continued)

FOREIGN PATENT DOCUMENTS

| CN | 101788260 | 7/2010 |
| CN | 101876528 | 11/2010 |

*Primary Examiner* — Huy Q Phan
*Assistant Examiner* — Temilade Rhodes-Vivour
(74) *Attorney, Agent, or Firm* — Hodgson Russ LLP

(57) ABSTRACT

A device for globally measuring a thickness of a metal film (901), comprises: a base (10); a rotating unit (20) comprising a fixed member (21) fixed on the base (10) and a rotating member (22) having a rotating joint (23); a working table (50) fixed on the rotating member (22) and having a vacuum passage which is formed therein and connected with the rotating joint (23); a linear driving unit (30) including a guide rail (31) fixed on the base (10) and a sliding block (32) slidable along the guide rail (31); a cantilever beam (40) disposed horizontally and defining a first end fixed with the sliding block (32) and a second end; a measuring head (80) connected to the second end of the cantilever beam (40), facing a surface of the working table (50) and having an eddy current probe (82) disposed therein.

5 Claims, 5 Drawing Sheets

(56) References Cited

U.S. PATENT DOCUMENTS

| | | |
|---|---|---|
| 7,204,639 B1 | 4/2007 | Gotkis et al. |
| 2002/0053904 A1 | 5/2002 | Chen et al. |
| 2004/0032256 A1 | 2/2004 | Suto et al. |
| 2004/0138838 A1 | 7/2004 | Scheiner et al. |
| 2008/0094593 A1* | 4/2008 | Shibazaki ............ G03F 7/70725 355/53 |
| 2008/0218713 A1* | 9/2008 | Shibazaki ........................ 355/52 |
| 2009/0059217 A1* | 3/2009 | Okita .......................... 356/237.5 |

* cited by examiner

DEVICE FOR GLOBALLY MEASURING THICKNESS OF METAL FILM

CROSS REFERENCE TO RELATED APPLICATIONS

This U.S. application claims priority under 35 U.S.C. 371 to, and is a U.S. National Phase application of, the International Application No. PCT/CN2011/082384, filed Nov. 17, 2011, which claims the benefits of Chinese Patent Application No. 201110046521.7, filed with State Intellectual Property Office, P. R. C. on Feb. 25, 2011, the entire content of which is incorporated herein by reference.

FIELD

The present invention generally relate to a measuring device, particularly to a device for globally measuring a thickness of a metal film.

BACKGROUND

With the development of integrated circuits (IC), a diameter of the wafer can reach more than 300 mm and a characteristic line width of the wafer can reach less than 45 nm. Conventionally, new semiconductors, conductors, and dielectric materials are applied to overcome problems caused by the increase of integration degree, such as high power consumption and signal delay. A rapid development of IC is limited by copper interconnection. Accordingly, mediums with lower k, smaller line width, and multiple layers are effective methods to make an improvement. However, a medium layer with low k has a mechanical strength much smaller than copper lines, so that the media layer may be easily damaged during a high-stress CMP (chemical mechanical polishing) process. In order to solve the above problems, a two-step polishing method is applied. The copper layer may be firstly polished to a certain extend with the high-stress CMP (the first step), and secondly polished without the use of stress (the second step). Before the second step is performed, the thickness of the copper film on each desired points of the workpiece needs to be measured. An eddy current method is a non-contact measuring method, which does not damage the copper film during the measuring process and has high accuracy. However, in a conventional measuring device, the lift-off (i.e. a distance between a measuring sensor of the measuring device and the film to be measured) is not stable, which has a bad influence on the measuring accuracy.

SUMMARY

The present invention seeks to solve at least one of the problems existing in the related art to at least some extent.

Accordingly, there is provided a device for measuring a thickness of a metal film, which has a lift-off stabilized in a small range and achieves globally measuring the thickness of a film on a workpiece rapidly and precisely.

The device according to embodiments of a first broad aspect of the present invention comprises: a base; a rotating unit comprising a fixed member fixed on the base and a rotating member having a rotating joint; a working table fixed on the rotating member and having a vacuum passage which is formed therein and connected with the rotating joint; a linear driving unit including a guide rail fixed on the base and a sliding block slidable along the guide rail; a cantilever beam disposed horizontally and defining a first end fixed with the sliding block and a second end; a measuring head connected to the second end of the cantilever beam, facing a surface of the working table and having an eddy current probe disposed therein.

With the device for measuring the thickness of the metal film according to embodiments of the present invention, a lift-off distance between the eddy current probe and a workpiece (to be measured and on which the metal film is formed) may be self-adapted, thus the lift-off distance may not be influenced by the accuracy of mechanical movements of related devices or the thickness of the workpiece, so that the lift-off distance may be stabilized in a small range and globally measuring the thickness of the metal film rapidly and precisely may be achieved, without contacting the eddy current probe with the metal film.

In some embodiments, the linear driving unit is a linear motor.

In some embodiments, the eddy current probe is configured as an axisymmetric coil.

In some embodiments, the device further comprises a signal generator configured to send sequence signals to the eddy current probe, and a signal acquisition card configured to acquire detecting signals of the eddy current probe.

In some embodiments, the sequence signal has a frequency selected from a group consisting of: 1 KHz, 2 KHz, 4 KHz, 8 KHz, 16 KHz, 32 KHz, 64 KHz, 128 KHz, 512 KHz, 1 MHz, 2 MHz, 4 MHz, 8 MHz, and 16 MHz.

The device according to embodiments of a second broad aspect of the present invention comprises: a base; a rotating unit comprising a fixed member fixed on the base and a rotating member having a rotating joint; a working table fixed on the rotating member and having a vacuum passage which is formed therein and connected with the rotating joint; a linear driving unit including a guide rail fixed on the base and a sliding block slidable along the guide rail; a cantilever beam defining a first end hinged to the sliding block and a second end; an electromagnet fixed on the sliding block; an iron block fixed on a lower surface of the first end of the cantilever beam and opposed to the electromagnet; a measuring head connected to the second end of the cantilever beam, facing a surface of the working table, and having an eddy current probe disposed therein, a vertical vent hole, and a vertical throttling hole, the vertical vent hole and the vertical throttling hole are communicated coaxially such that they penetrate the measuring head.

With the device for measuring the thickness of the metal film according to embodiments of the present invention, a lift-off distance between the eddy current probe and a workpiece (to be measured and on which the metal film is formed) may be self-adapted, thus the lift-off distance may not be influenced by the accuracy of mechanical movements of related devices or the thickness of the workpiece. Further, by means of hinging the cantilever beam on the sliding block, the lift-off distance may be stabilized in a small range and globally measuring the thickness of the metal film rapidly and precisely may be achieved, without contacting the eddy current probe with the workpiece.

In some embodiments, the vertical vent hole has a diameter larger than that of the vertical throttling hole.

In some embodiments, the eddy current probe is configured as an axisymmetric coil.

In some embodiments, the device further comprises a signal generator configured to send sequence signals to the eddy current probe, and a signal acquisition card configured to acquire detecting signals of the eddy current probe.

In some embodiments, the sequence signal has a frequency selected from a group consisting of: 1 KHz, 2 KHz, 4 KHz, 8

KHz, 16 KHz, 32 KHz, 64 KHz, 128 KHz, 512 KHz, 1 MHz, 2 MHz, 4 MHz, 8 MHz, and 16 MHz.

Additional aspects and advantages of embodiments of present invention will be given in part in the following descriptions, become apparent in part from the following descriptions, or be learned from the practice of the embodiments of the present invention.

BRIEF DESCRIPTION OF THE DRAWINGS

These and other aspects and advantages of embodiments of the present invention will become apparent and more readily appreciated from the following descriptions made with reference to the accompanying drawings, in which.

Figure 1:
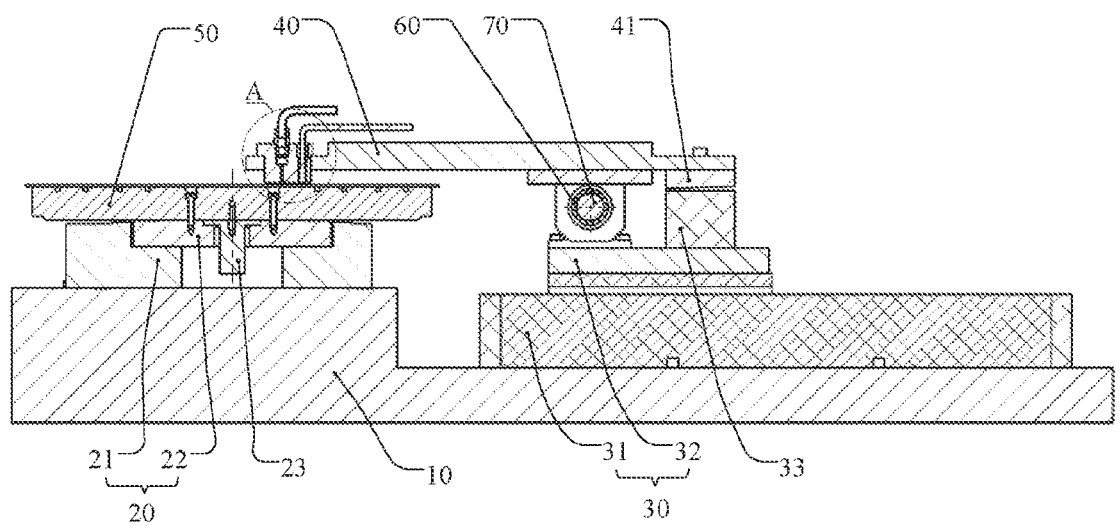
FIG. 1 is a structural schematic view of a device for globally measuring a thickness of a metal film according to an embodiment of the present invention.

1—base; 20—rotating unit; 21—fixed member;
22—rotating member; 23—rotating joint; 30—linear driving unit;
40—cantilever beam; 41—iron block; 50—working table;
60—bearing; 70—pin; 80—measuring head;
81—vent hole; 82—eddy current probe; 821—coil of eddy current probe;
823—equivalent circuit of coil of eddy current probe; 824—equivalent circuit of eddy current;
825—circuit principle for measuring thickness of metal film; 83 rent hole; 90—workpiece;
901—metal film to be measured.

DETAILED DESCRIPTION

Reference will be made in detail to embodiments of the present invention. The embodiments described herein with reference to drawings are explanatory, illustrative, and used to generally understand the present invention. The embodiments shall not be construed to limit the present invention. The same or similar members and the members having same or similar functions are denoted by like reference numerals throughout the descriptions.

In the specification, unless specified or limited otherwise, relative terms such as "longitudinal", "lateral", "above", "below", "front", "rear", "left", "right", "vertical", "horizontal", "top", "bottom" as well as derivative thereof (e.g., "horizontally", "downwardly", "upwardly", etc.) should be construed to refer to the orientation as then described or as shown in the drawings under discussion. These relative terms are for convenience of description and do not require that the present invention be constructed or operated in a particular orientation.

In addition, terms such as "first" and "second" are used herein for purposes of description and are not intended to indicate or imply relative importance or significance.

Terms concerning attachments, coupling and the like, such as "connected" and "interconnected", refer to a relationship in which structures are secured or attached to one another either directly or indirectly through intervening structures, as well as both movable or rigid attachments or relationships, unless expressly described otherwise. Unless specified or limited otherwise, the terms "mounted," "connected," "supported," and "coupled" and variations thereof are used broadly and encompass both direct and indirect mountings, connections, supports, and couplings. Further, "connected" and "coupled" are not restricted to physical or mechanical connections or couplings.

Figure 6:
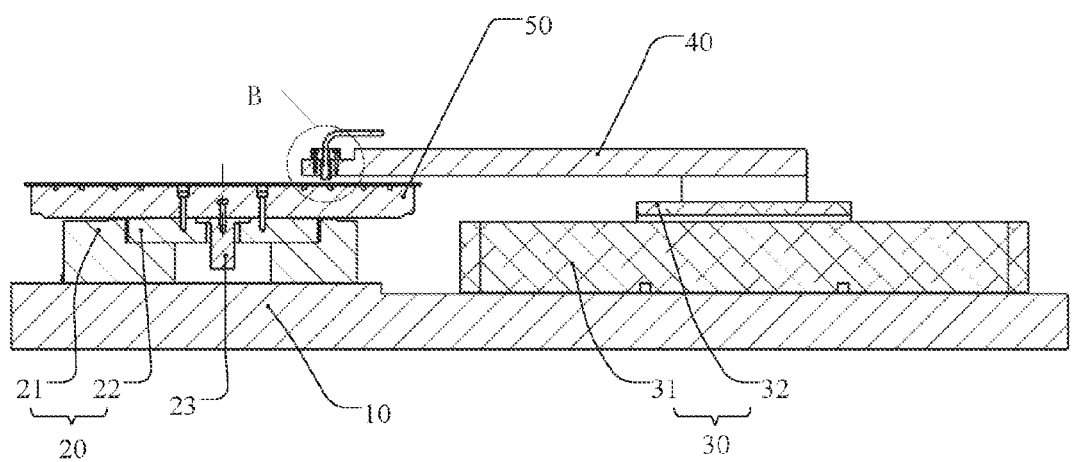
FIG. 6 is a structural schematic view of a device for globally measuring a thickness of a metal film according to a further embodiment of the present invention.

A device for globally measuring a thickness of a metal film according to an embodiment of the present invention is described in the following with reference to FIG. 6. As shown in FIG. 6, the device for globally measuring the thickness of the metal film comprises a base 10, a rotating unit 20, and a linear driving unit 30.

The rotating unit 20 comprises a fixed member 21 fixed on the base 10 and a rotating member 22 having a rotating joint 23. The device further comprises a working table 50 fixed on the rotating member 23 and configured to place the workpiece to be measured 90, and the working table 50 has a vacuum passage formed therein and connected with the rotating joint 23, so that the working table 50 is capable of absorbing the workpiece to be measured 90 by vacuum. The linear driving unit 30 includes a guide rail 31 fixed on the base 10 and a sliding block 32 slidable along the guide rail 31. The device further comprises a cantilever beam 40 disposed horizontally and defining a first end fixed with the sliding block 32 and a second end. The device further comprises a measuring head 80 connected to the second end of the cantilever beam 40, facing a surface of the working table 50, and having an eddy current probe 82 disposed therein.

With the device for measuring the thickness of the metal film according to embodiments of the present invention, a lift-off distance between the eddy current probe 82 and the workpiece to be measured 90 (on which the metal film is formed) may be self-adapted, thus the lift-off distance may not be influenced by the accuracy of mechanical movements of related devices or the thickness of the workpiece to be measured 90, so that the lift-off distance may be stabilized in a small range and globally measuring the thickness of the metal film rapidly and precisely may be achieved, without contacting the eddy current probe 82 with the workpiece to be measured 90.

Figure 2:
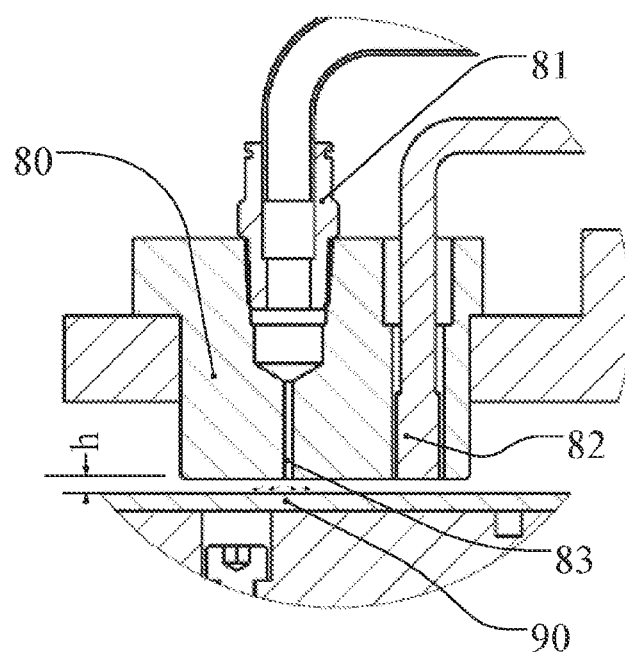
FIG. 2 is a partial enlarged view of area A in FIG. 1.

A device for globally measuring a thickness of a metal film according to an embodiment of the present invention is described in the following with reference to FIGS. 1 and 2. As shown in FIGS. 1 and 2, the device for globally measuring the thickness of the metal film comprises a base 10, a rotating unit 20, and a linear driving unit 30.

The rotating unit 20 comprises a fixed member 21 fixed on the base 10 and a rotating member 22 having a rotating joint 23. The device further comprises a working table 50 fixed on the rotating member 22 and configured to place a workpiece to be measured 90, and the working table 50 has a vacuum passage which is formed therein and connected with the rotating joint 23, so that the working table 50 is capable of absorbing the workpiece to be measured 90 by vacuum. The linear driving unit 30 includes a guide rail 31 fixed on the base 10 and a sliding block 32 slidable along the guide rail 31. The device further comprises a cantilever beam 40 defines a first end hinged to the sliding block 32 and a second end. Specifically, the sliding block 32 is hinged with the cantilever beam 40 via a bearing 60 and a pin 70. An electromagnet 33 is fixed on the sliding block 32, and an iron block 41 is fixed on a lower surface of the first end of the cantilever beam 40 and opposed to the electromagnet 33, so that the measuring head 80 may be lifted up and drop down by controlling the absorption and release between the electromagnet 33 and the iron block 41. The device further comprises a measuring head 80 connected to the second end of the cantilever beam 40, facing a surface of the working table 50, and having an eddy current probe 82 disposed therein, a vertical vent hole 81, and a vertical throttling hole 83. The vertical vent hole 81 and the vertical throttling hole 83 are communicated coaxially such that they penetrate the measuring head, so that the vent hole 81 may be filled with gas and the measuring head 80 may perform an air-floatation above a surface of the workpiece to be measured 90.

With the device for measuring the thickness of the metal film according to embodiments of the present invention, a lift-off distance between the eddy current probe 82 and the workpiece to be measured 90 may be self-adapted, thus the lift-off distance may not be influenced by the accuracy of mechanical movements of related devices or the thickness of workpiece to be measured 90. Further, by means of hinging the cantilever beam 40 on the sliding block 32, the lift-off distance may be stabilized in a smaller range and globally measuring the thickness of the metal film rapidly and precisely may be achieved, without contacting the eddy current probe 82 with the workpiece to be measured 90.

Measuring a global thickness of a metal film on a workpiece to be measured 90 with a device for globally measuring a thickness of a metal film according to embodiments of the present invention will be described in the following with reference to FIGS. 1-8.

When measuring the global thickness of the metal film of the workpiece to be measured 90 with the device for globally measuring the thickness of the metal film according to embodiments of the present invention, the electromagnet 33 is disconnected with electric power. And a distance between the measuring head 80 and the workpiece to be measured 90 is adapted by controlling a pressure and a flow rate of the gas passing the vent hole 81. With a rotation of the rotating unit 20 and a translation of the sliding block 32, the eddy current probe 82 may move across a certain area or be positioned in a desired measuring points.

Figure 4A:
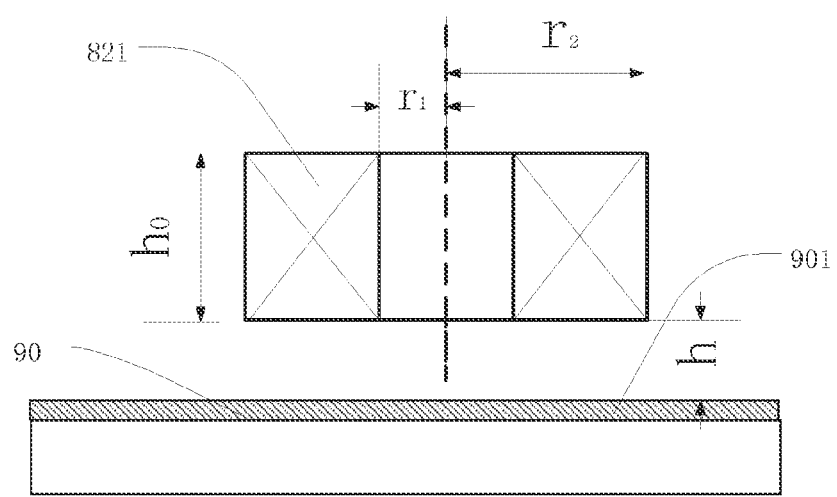
FIG. 4a is a schematic view showing measuring a workpiece with a coil of an eddy current probe of a device for globally measuring a thickness of a metal film according to an embodiment of the present invention.
Figure 4B:
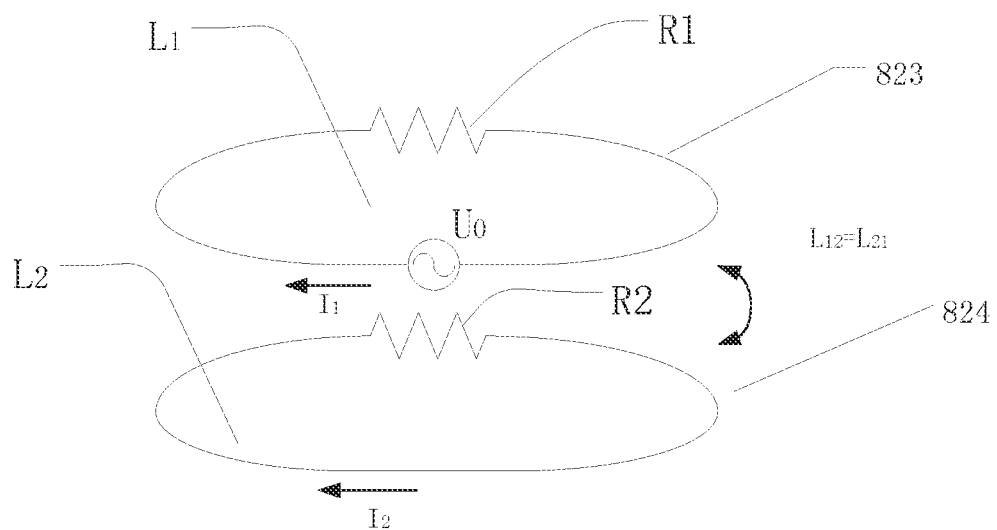
FIG. 4b shows an equivalent circuit of a coil of the eddy current probe, and an equivalent circuit of the eddy current.
Figure 4C:
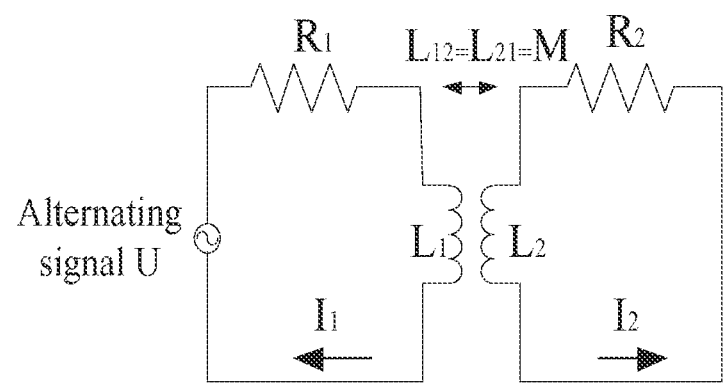
FIG. 4c shows a circuit principle for measuring a thickness of a metal film.

FIGS. 4a-4c show a principle for measuring a thickness of a metal film on the workpiece to be measured 90 with an eddy current probe 82 of a device for globally measuring a thickness of a metal film according to embodiments of the present invention. Specifically, the eddy current probe 82 may be an axisymmetric coil 821. The workpiece to be measured 90 is disposed below the eddy current probe 82, and the metal film 901 is formed on a surface of the workpiece to be measured 90. Before measuring, a calibration is performed. A series of reference workpieces whose thicknesses are already known are placed on a surface of the working table 50. When the measuring head 80 starts to work, the reference workpiece rotates under the rotation of the working table 50. The eddy current probe 82 is driven by the linear driving unit 30 and moves to a position above a measuring point on the reference workpiece. When the device is in operation, an alternating signal U0 is charged, thus causing an alternating magnetic field thereof, which equals to a loop circuit 823, and a coil resistance is R1 in the loop circuit 823. When the metal film to be measured moves close to the coil, due to the existence of the alternating magnetic field, an eddy current (i.e. a loop current) is generated in the metal film to be measured, which equals to a loop circuit 824, and a resistance of the metal film is R2 in the loop circuit 824. The loop circuits 823, 824 are interacted with each other via a first inductor L12 and a second inductor L21. An equivalent circuit 825 thereof is analyzed with Kirchhoff's law, and the equivalent inductance Lc of the coil 821 may be obtained with a formula of:

$$L_c = L_1 - \frac{\omega L_{12} L_{21}}{R_2^2 + \omega^2 L_2^2}(\omega L_2 + jR_2).$$

It can be observed that, an entity L of the equivalent inductance Lc changes with a change of the frequency, i.e.

$$L = Re(L_c) = L_1 - \frac{L_{12} L_{21} L_2}{\frac{R_2^2}{\omega^2} + L_2^2}.$$

For a determined sensor structure, L12, L21, and L2 may not change with a change of the excitation frequency. When the thickness of the metal film is much smaller than a skin depth under the excitation frequency $$\delta = \sqrt{2/\mu\omega\sigma},$$

an equivalent resistance R2 of the metal film may not change with the frequency. In above formula, μ is a magnetic conductivity, ω is a circular frequency, and σ is an electric conductivity. As for metal copper, when the frequency is 1 MHz, the skin depth is 66.7 μm.

Therefore, in the case when L12, L21, and L2 are all constant and are not going to change with a change of the circular frequency, an L-ω curve (curves showing the change of the entity L of the equivalent inductance with the change of the frequency ω) shows a decreasing trend.

It can be concluded that, the equivalent inductance L relates not only to the coil inductance L1 and the equivalent inductance L2 of the metal film as well as the interacting inductance L21 therebetween, but also changes with a change of the equivalent resistance R2 of the metal film. When the thickness of the metal film increases, R2 decreases and L may change accordingly. In that way, the thickness of the metal film may be determined by measuring the change of L, where the equivalent inductance L is represented as: L=A−B/(C/ω²+D), in which A=L1, B=L21 L12 L2, and $$C/D = \left(\frac{R_2}{L_2}\right)^2.$$

In order to obtain a resolution as high as possible, the equivalent inductance L is taken derivatives with respect to the frequency ω of the excitation signal, obtaining:

$$L' = \frac{const}{\frac{L_2^4}{R_2^2}\omega^3 + 2L_2^2\omega + \frac{R_2^2}{\omega}},$$

and when ω satisfies:

$$\omega = \omega_0 = \frac{\sqrt{3}\,R_2}{3L_2} = \sqrt{C/(3D)},$$

L' has the maximum value, i.e. L changes most significantly with the change of ω, which frequency is also defined as a characteristic frequency.

It can be concluded from the above analysis, C/D value corresponds to a turning point of the L-ω curve, and the turning point corresponds to the characteristic frequency ω0. If ω0 can be determined where L reaches to the maximum value, the thickness of the metal film may also be determined according to the relation between the characteristic frequency ω0 and the thickness of the metal film. Further, as the above formula of L' shows, the characteristic frequency ω0 is independent of the distance h between the eddy current probe and the work piece (R2 and L2 are both independent of h).

Figure 5:
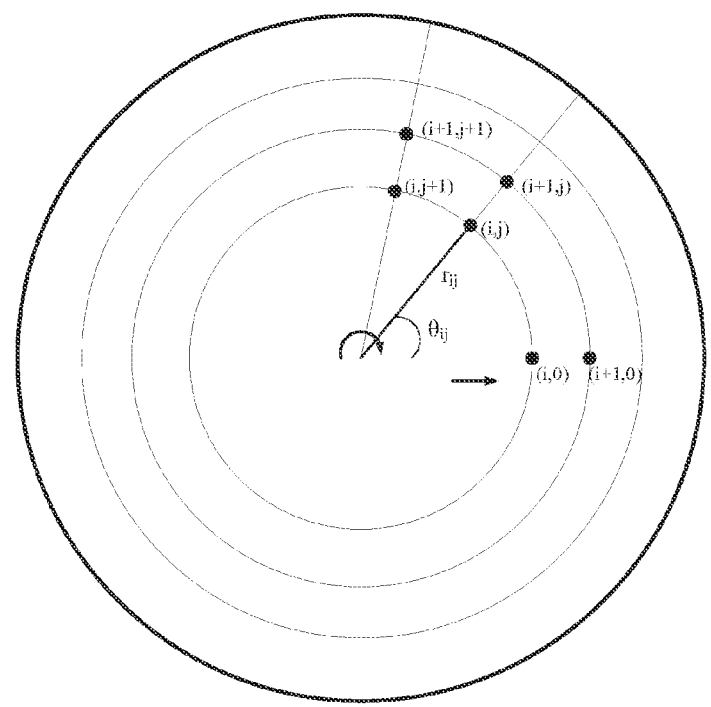
FIG. 5 is a schematic view showing globally measuring a thickness with a device for globally measuring a thickness of a metal film according to an embodiment of the present invention.

As shown in FIG. 5, a method for globally measuring the thickness of the metal film is described below. According to a number of the measuring points on the metal film, the eddy current probe 82 moves from the center to the edge, or from the edge to the center of the workpiece to be measured 90 above the metal film 901 intermittently. After one movement for a certain distance, the eddy current probe 82 stops for a while and the next movement is followed, until the rotating member 22 rotates for one whole circle. That is to say, the eddy current probe 82 measures at one measuring point on the metal film 901, then moves to an adjacent measuring point which is at a predetermined degree with the prior measuring point, after stops for a while, moves to a next measuring point, and the steps are performed in a similar way until the measuring points on one circumference of the workpiece to be measured 90 are all measured. Then the eddy current probe 82 moves to measure measuring points on a next circumference of the workpiece to be measured 90. Thereby, a global thickness distribution of the workpiece to be measured 90 may be obtained according a movement value ($r_{ij}$) and the rotating degree ($\theta_{ij}$) corresponding to each measuring point (i, j), as well as the thickness obtained at each measuring point.

Figure 7:
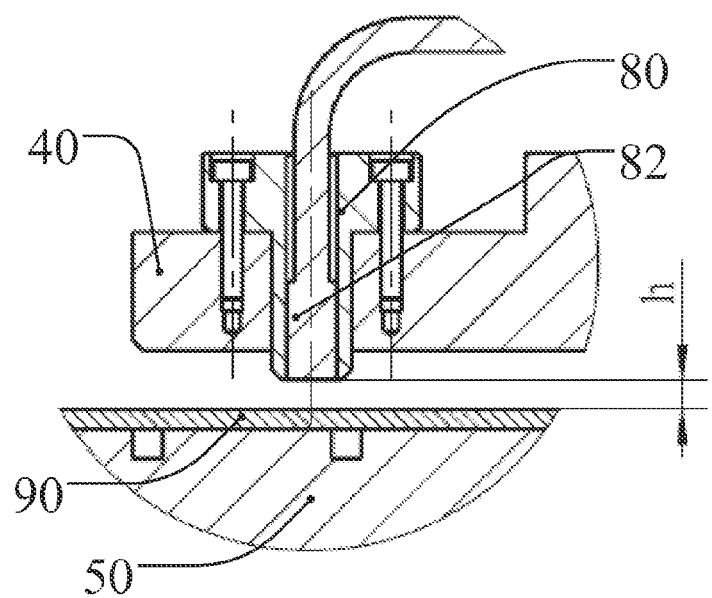
FIG. 7 is a partial enlarged view of area B in FIG. 6.

In some embodiments of the present invention, referring to FIGS. 6 and 7, when a requirement for a fluctuation of the distance between the eddy current probe 82 and the work piece 90 is not rather high, the cantilever beam 40 may be fixed with the sliding block 32. Specifically, the linear driving unit 30 may be a linear motor, alternatively, the linear driving unit 30 may be a lead-screw cooperation motor, in which the cantilever beam 40 is fixed on the motor. The sliding block 32 is configured to slide linearly in the horizontal direction with a drive of the linear motor or the lead-screw cooperation motor. In the present embodiment, an air-floating unit is not required for the measuring head 80. During the installation process, the distance between the measuring head 80 and the working table 50 may be adjusted to a desired value, and the thickness of the metal film 901 may be determined according to the characteristic frequency determined by the frequency-scanning measurement.

Figure 8:
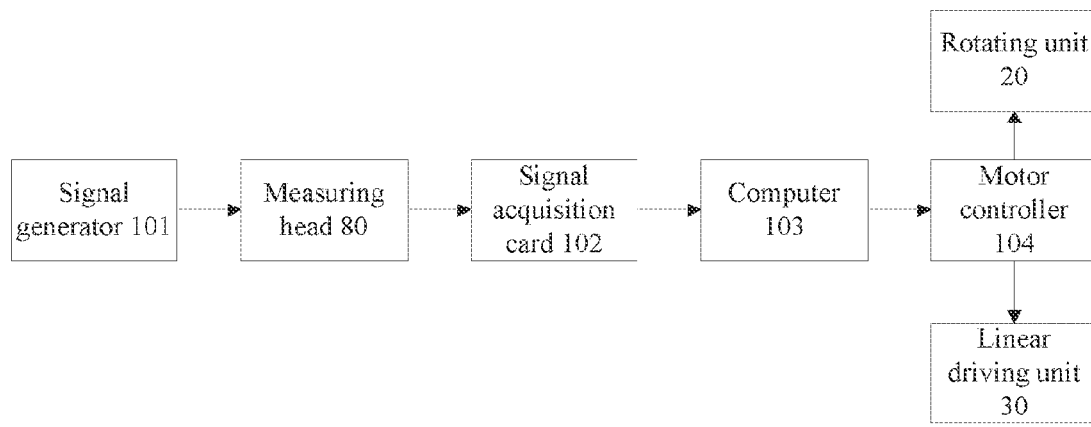
FIG. 8 is a diagram showing a signal processing unit of a device for globally measuring a thickness of a metal film according to an embodiment of the present invention.

As shown in FIG. 8, the device further comprises a signal processing unit, in which a motor controller 104 is controlled by processes of a computer 103. When the measuring head 80 stops, a signal generator 101 may send sequence signals to the eddy current probe 82. In other words, the eddy current probe 82 may receive the sequence signal from the signal generator 101. Specifically, the sequence signal has a frequency selected from a group consisting of: 1 KHz, 2 KHz 4 KHz, 8 KHz, 16 KHz, 32 KHz, 64 KHz, 128 KHz, 512 KHz, 1 MHz, 2 MHz, 4 MHz, 8 MHz, and 16 MHz. Then the signal acquisition card 102 acquires detecting signals of the eddy current probe 82 and input the detecting signal to the computer 103. The computer 103 processes the detecting signal and records the thicknesses of the metal film. After measuring the thickness at one measuring point (i, j) of the metal film 901 is finished, the computer 103 sends an instruction to the motor controller 104, so that the motor controller 104 controls the motor to rotate so as to rotate the rotating unit 20, and stops in the next measuring point on a same circumference with the prior measuring point, so as to finish measuring thickness on the measuring point of the metal film. Then the measuring process is repeated, until all desired measuring points on one circumference of the metal film 901 are measured. After all desired measuring points on one circumference of the metal film 901 are measured, the computer 103 sends another instruction to the motor controller 104, and the motor controller 104 controls the linear motor or lead-screw cooperation motor in the linear driving unit 30 to drive the eddy current probe 82 to move to the next circumference via the sliding block 32 and the cantilever beam 40. The measurement continues, until a global thickness distribution of the workpiece to be measured 90 is obtained.

Figure 3:
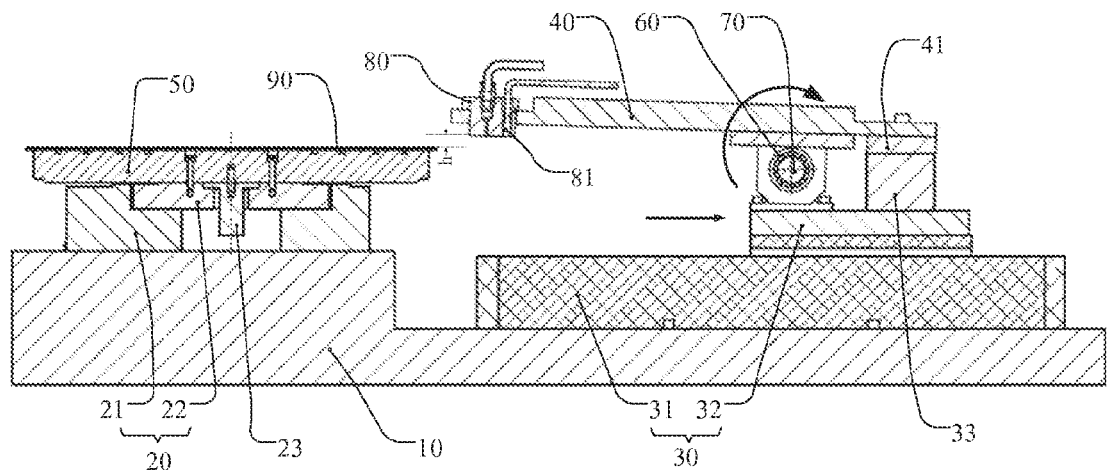
FIG. 3 is a structural schematic view of a device for globally measuring a thickness of a metal film according to an embodiment of the present invention.

With reference to FIG. 3, after the measurement is finished, the measuring head 80 stops work, and the electromagnet 33 may be connected to electric power. The cantilever beam 40 rotates to lift the measuring head 80 upwardly, and the linear drive unit 30 moves away from the workpiece to be measured 90, so that the measuring head 80 moves away from the surface of the workpiece to be measured 90, which facilitates the assembly and the remove of the workpiece to be measured 90.

Reference throughout this specification to "an embodiment," "some embodiments," "one embodiment", "another example," "an example," "a specific example," or "some examples," means that a particular feature, structure, material, or characteristic described in connection with the embodiment or example is included in at least one embodiment or example of the present invention, Thus, the appearances of the phrases such as "in some embodiments," "in one embodiment", "in an embodiment", "in another example," "in an example," "in a specific example," or "in some examples," in various places throughout this specification are not necessarily referring to the same embodiment or example of the present invention. Furthermore, the particular features, structures, materials, or characteristics ma be combined in any suitable manner in one or more embodiments or examples.

Although explanatory embodiments have been shown and described, it would be appreciated by those skilled in the art that the above embodiments cannot be construed to limit the present invention, and changes, alternatives, and modifications can be made in the embodiments without departing from spirit, principles and scope of the present invention.

What is claimed is:

1. A device for globally measuring a thickness of a metal film, comprising:
   a base;
   a rotating unit comprising a fixed member fixed on the base and a rotating member having a rotating joint;

a working table fixed on the rotating member and having a vacuum passage which is formed therein and connected with the rotating joint;

a linear driving unit including a guide rail fixed on the base and a sliding block slidable along the guide rail;

a cantilever beam defining a first end hinged to the sliding block and a second end;

an electromagnet fixed on the sliding block;

an iron block fixed on a lower surface of the first end of the cantilever beam and opposed to the electromagnet;

a measuring head connected to the second end of the cantilever beam, facing a surface of the working table, and having an eddy current probe disposed therein, a vertical vent hole, and a vertical throttling hole, the vertical vent hole and the vertical throttling hole are communicated coaxially such that they penetrate the measuring head.

2. The device according to claim 1, wherein the vertical vent hole has a diameter larger than that of the vertical throttling hole.

3. The device according to claim 1, wherein the eddy current probe is configured as an axisymmetric coil.

4. The device according to claim 1, further comprising a signal generator configured to send sequence signals to the eddy current probe, and a signal acquisition card configured to acquire detecting signals of the eddy current probe.

5. The device according to claim 4, wherein the sequence signal has a frequency selected from a group consisting of: 1 KHz, 2 KHz, 4 KHz, 8 KHz, 16 KHz, 32 KHz, 64 KHz, 128 KHz, 512 KHz, 1 MHz, 2 MHz, 4 MHz, 8 MHz, and 16 MHz.

* * * * *